(12) United States Patent
Sasahara et al.

(10) Patent No.: US 10,964,546 B2
(45) Date of Patent: Mar. 30, 2021

(54) SUBSTRATE PROCESSING METHOD AND METHOD FOR REMOVING BORON-DOPED SILICON

(71) Applicant: TOKYO ELECTRON LIMITED, Tokyo (JP)

(72) Inventors: Reiko Sasahara, Nirasaki (JP); Tsuhung Huang, Nirasaki (JP); Teppei Okumura, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 28 days.

(21) Appl. No.: 16/308,572

(22) PCT Filed: Mar. 30, 2017

(86) PCT No.: PCT/JP2017/014299
§ 371 (c)(1),
(2) Date: Dec. 10, 2018

(87) PCT Pub. No.: WO2017/217087
PCT Pub. Date: Dec. 21, 2017

(65) Prior Publication Data
US 2019/0157093 A1   May 23, 2019

(30) Foreign Application Priority Data

Jun. 14, 2016  (JP) .............................. JP2016-117950

(51) Int. Cl.
*H01L 21/324*    (2006.01)
*H01L 21/3065*   (2006.01)
*H01L 21/3213*   (2006.01)
*H01L 21/3215*   (2006.01)
*H01L 21/67*     (2006.01)

(52) U.S. Cl.
CPC ........ *H01L 21/3065* (2013.01); *H01L 21/324* (2013.01); *H01L 21/32135* (2013.01); *H01L 21/3215* (2013.01); *H01L 21/67069* (2013.01)

(58) Field of Classification Search
CPC ........... H01L 21/67069; H01L 21/3065; H01L 21/32135; H01L 21/324; H01L 21/3215; H01J 37/32834; H01J 37/3244; H01J 37/32082; H01J 2237/332; H01J 2237/0047; H01J 2237/334; H01J 37/32532
USPC ....... 438/700, 706, 710, 712, 714, 715, 719, 438/723, 519, 530; 216/67, 74, 79
See application file for complete search history.

(56) References Cited

U.S. PATENT DOCUMENTS 9,406,523 B2 *  8/2016  Chen ................. H01L 21/31116
2010/0087052 A1 *  4/2010  Xu ........................ H01J 37/321
                                                                    438/530

(Continued)

FOREIGN PATENT DOCUMENTS

JP        4325473 B2      9/2009
JP      2011192776 A1     9/2011

*Primary Examiner* — Lan Vinh
(74) *Attorney, Agent, or Firm* — Nath, Goldberg & Meyer; Jerald L. Meyer

(57) ABSTRACT

There is provided a substrate processing method which is capable of suitably etching a boron-doped silicon. According to the present invention, a wafer W including an SiB layer made of boron-doped silicon is exposed to a fluorine gas and an ammonia gas, and the wafer W mounted on a stage is heated.

10 Claims, 7 Drawing Sheets

(56) References Cited

U.S. PATENT DOCUMENTS

| | | | | |
|---|---|---|---|---|
| 2011/0287577 A1* | 11/2011 | Stewart | ............... | H01L 31/1868 438/88 |
| 2014/0011350 A1* | 1/2014 | Seong | ............... | H01L 29/42328 438/593 |
| 2014/0308816 A1* | 10/2014 | Wang | ................ | H01J 37/32357 438/719 |
| 2015/0325411 A1* | 11/2015 | Godet | ............... | H01J 37/32357 216/59 |
| 2016/0064523 A1* | 3/2016 | Adam | ............... | H01L 29/66636 438/198 |

\* cited by examiner

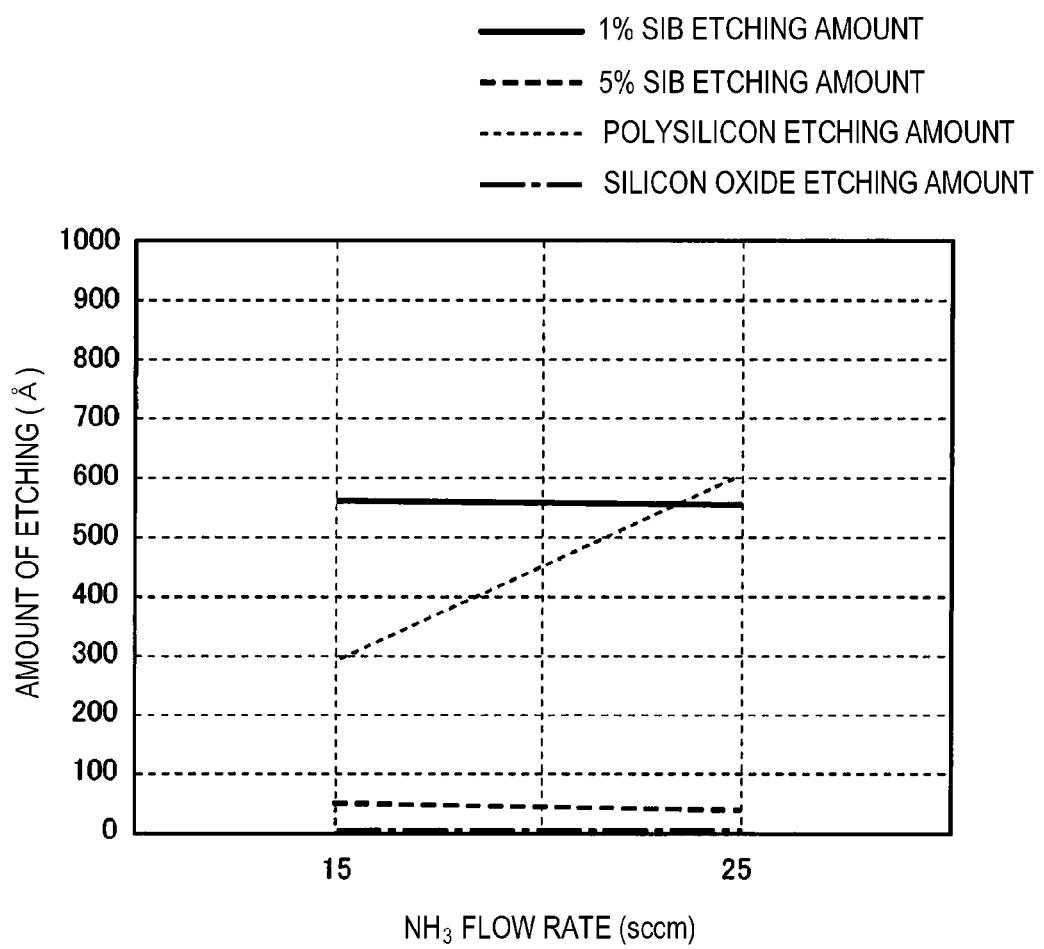

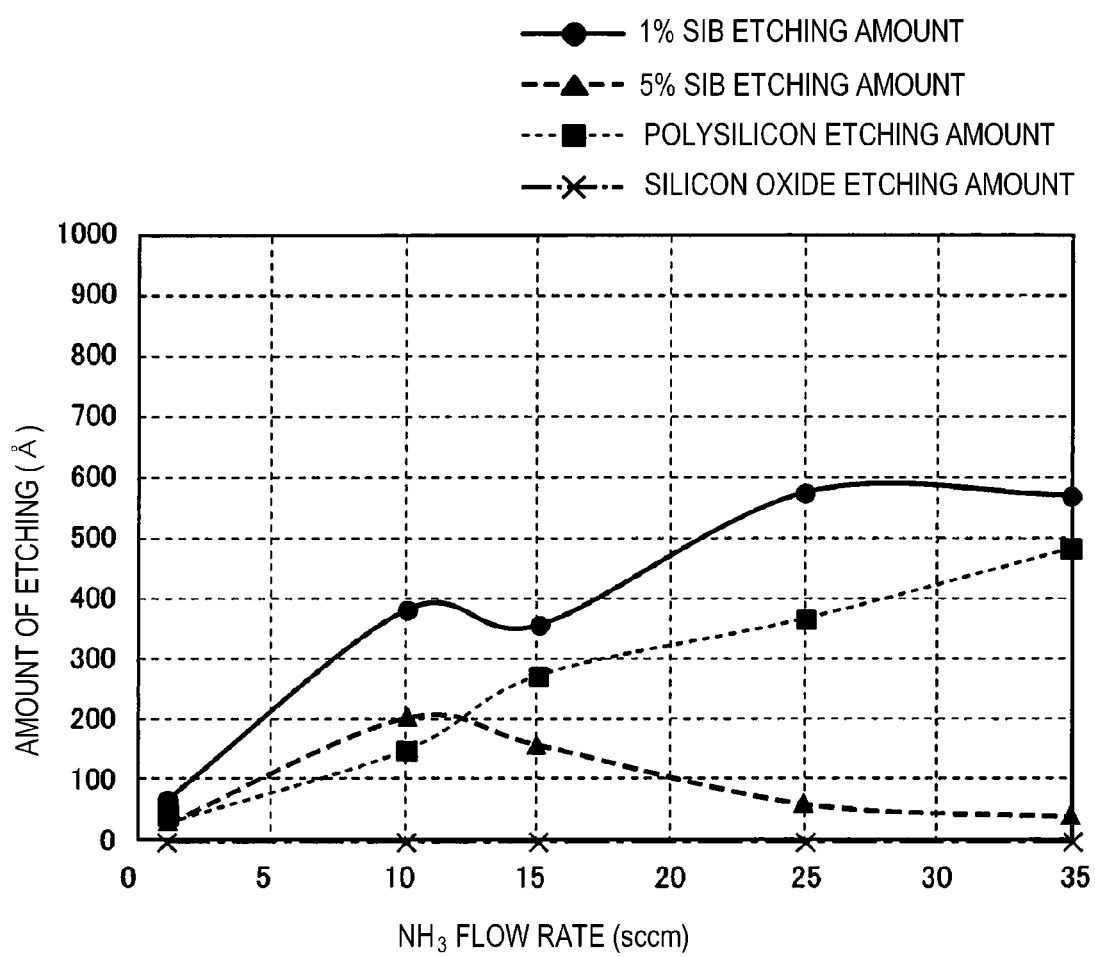

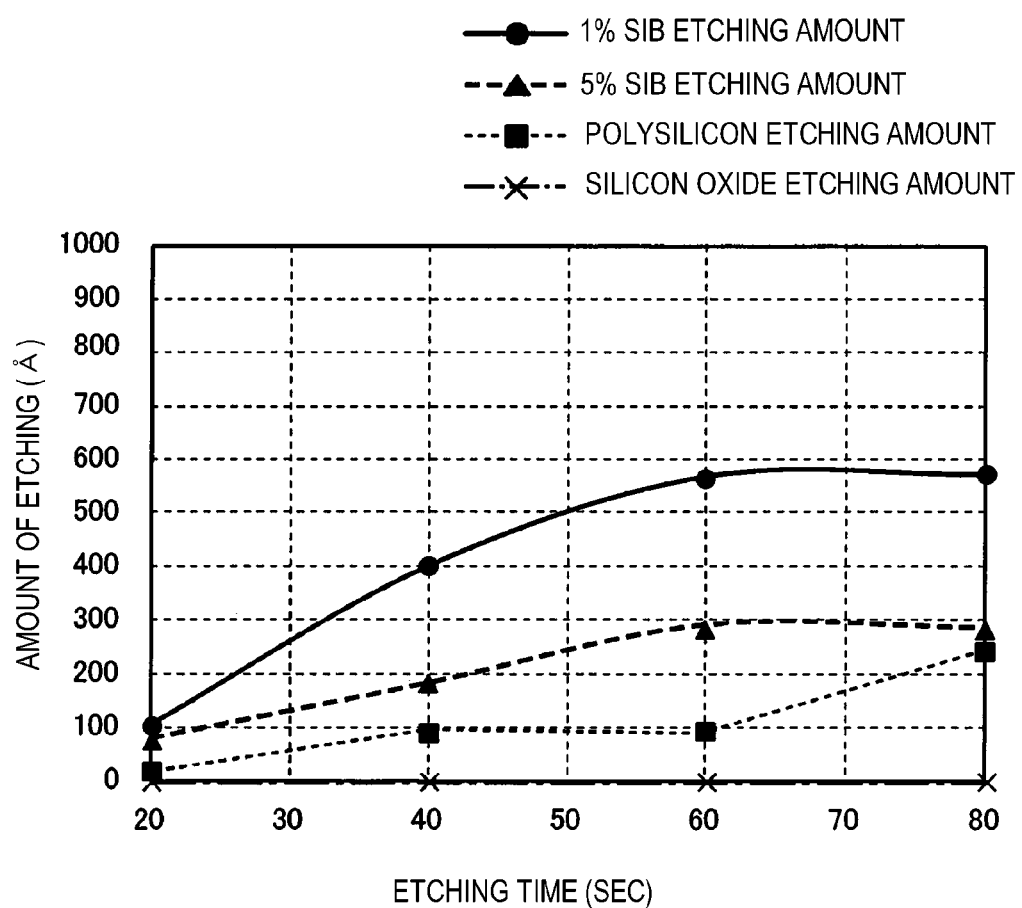

SUBSTRATE PROCESSING METHOD AND METHOD FOR REMOVING BORON-DOPED SILICON

TECHNICAL FIELD

The present disclosure relates to a substrate processing method for etching a boron-doped silicon without using plasma and a method for removing the boron-doped silicon.

BACKGROUND

In recent years, studies on positively using boron-doped silicon (hereinafter, referred to as "SiB") in the process of manufacturing a semiconductor device have been conducted. In particular, since SiB has a good gap-fill property, using such a SiB to fill a via hole and trench in, for example, a three-dimensional mounting device has been studied. In this case, it is necessary to etch and remove surplus SiB that seeps out from the via hole or the trench.

Incidentally, in general, a boron-doped material is known as a material that is hard-to-etch. For example, on the basis that a boron-doped material is a hard-to-etch material, there has been proposed a technique that uses a hydrogen fluoride (HF) gas to etch a boron-nondoped silicon oxide film with respect to a boron-doped silicon oxide film with high selectivity (see, for example, Patent Document 1).

As a method of etching a boron-doped material, for example, there has been proposed a method of using HF gas and ammonia ($NH_3$) gas as a cleaning gas to remove an unnecessary film adhering to a BSG film (boron glass film) formed by TEOS (see, for example, Patent Document 2).

PRIOR ART DOCUMENTS

Patent Documents (Patent Document 1) Japanese Patent Laid-Open No. 2011-192776

(Patent Document 2) Japanese Patent No. 4325473

However, there is a problem in that it is difficult to suitably etch the boron-doped silicon (SiB) by the methods disclosed in Patent Document 1 and Patent Document 2.

SUMMARY

Some embodiments of the present disclosure provide a substrate processing method capable of suitably etching a boron-doped silicon and a method of removing the boron-doped silicon.

According to one embodiment of the present disclosure, there is provided a substrate processing method which includes: mounting a substrate including a target layer made of a boron-doped silicon on a mounting table; heating the substrate mounted on the mounting table; and exposing the target layer to a halogen gas and an ammonia gas ($NH_3$).

According to another embodiment of the present disclosure, there is provided a method of removing a boron-doped silicon, which includes: heating a target layer made of the boron-doped silicon; and exposing the target layer to a halogen gas and an ammonia gas ($NH_3$).

As described above, according to the present disclosure, a substrate including a target layer made of boron-doped silicon is mounted on a mounting table and is heated. In addition, the target layer is exposed to a halogen gas and a $NH_3$ gas. At this time, the boron-doped silicon and the halogen gas react with each other to generate a silicon halide or a boron halide. The generated silicon halide or boron halide is sublimated so that the boron-doped silicon is etched (removed). In this case, a boron-containing byproduct which inhibits the reaction between the boron-doped silicon and the halogen gas is also heated and sublimated. This makes it possible to suppress the boron-containing byproduct from inhibiting a new chemical reaction between the boron-doped silicon and the halogen gas. As a result, the generation and sublimation of the silicon halide and the boron halide are continuously performed, so that the boron-doped silicon can be suitably etched.

BRIEF DESCRIPTION OF THE DRAWINGS

FIG. 4 is a graph showing etching amounts of a polysilicon layer and an SiB layer when a stage temperature is 80 degrees C.

FIG. 5 is a graph showing etching amounts of the polysilicon layer and the SiB layer when the stage temperature is 90 degrees C.

FIG. 7 is a graph showing etching amounts of the polysilicon layer and the SiB layer when the stage temperature is 120 degrees C.

DETAILED DESCRIPTION

As a result of the earnest research conducted by the present inventors, it was found that a boron-doped silicon can be suitably etched by mounting a substrate including a target layer made of the boron-doped silicon on a mounting table, heating the substrate and exposing the target layer to a halogen gas and an ammonia ($NH_3$) gas. The present disclosure is based on this finding.

Hereinafter, embodiments of the present disclosure will be described in detail with reference to the drawings.

Figure 1:
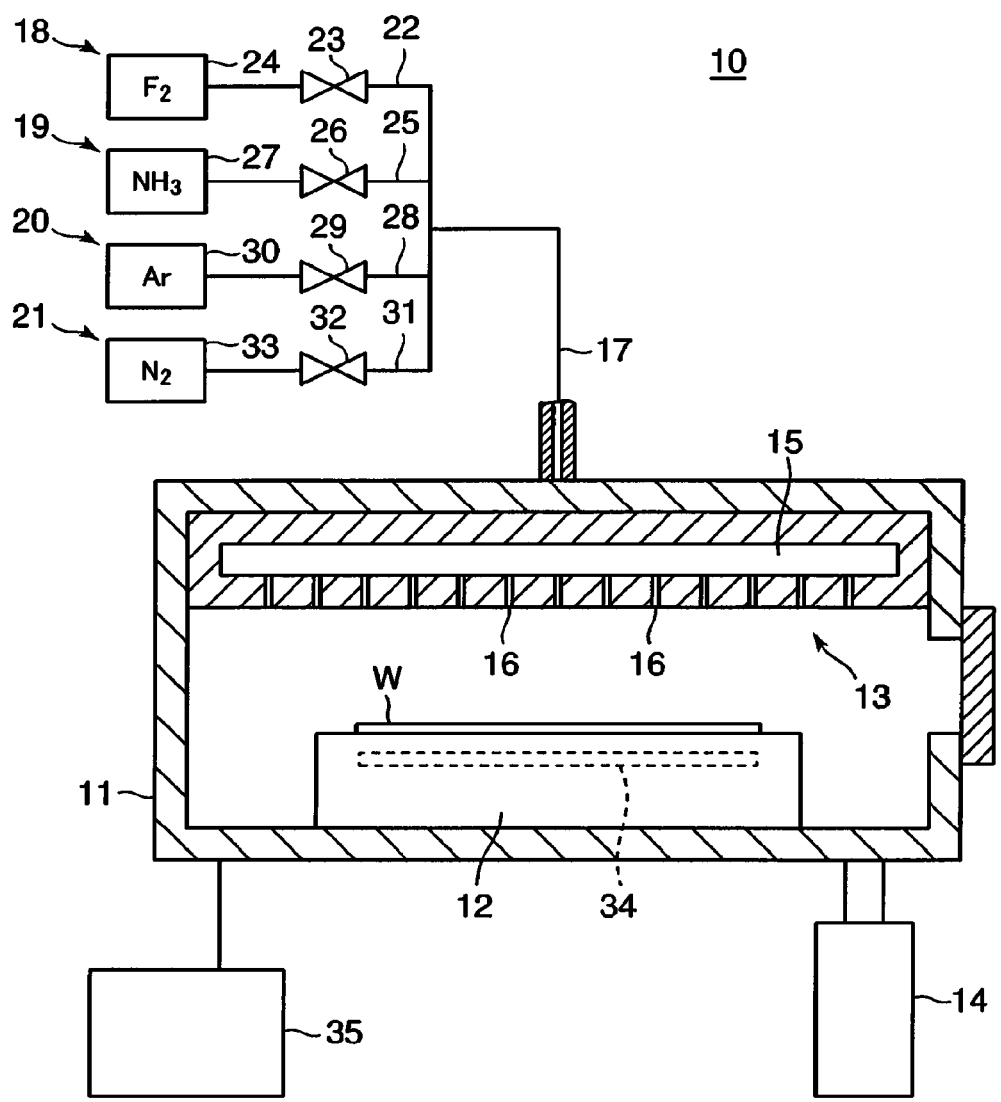
FIG. 1 is a cross-sectional view schematically showing the configuration of an etching apparatus that executes a substrate processing method according to an embodiment of the present disclosure.

FIG. 1 is a cross-sectional view schematically showing the configuration of an etching apparatus that executes a substrate processing method according to an embodiment of the present disclosure.

In FIG. 1, an etching apparatus 10 includes a chamber 11 as a processing chamber, a stage 12 as a mounting table disposed inside the chamber 11, a shower head 13 disposed in an upper portion of the chamber 11 so as to face the stage 12, and an exhaust unit 14 for exhausting gases inside the chamber 11. The etching apparatus 10 performs an etching process on a wafer W (substrate) including a target layer made of SiB. At this time, the wafer W is mounted on the stage 12. The shower head 13 is formed in a plate shape and includes a buffer chamber 15 defined therein. The buffer chamber 15 is in communication with the interior of the chamber 11 via a plurality of gas vent holes 16. In addition, the shower head 13 is coupled to a fluorine gas supply system 18, an ammonia gas supply system 19, an argon (Ar) gas supply system 20, and a nitrogen (N$_2$) gas supply system 21 via a gas supply pipe 17.

In the etching apparatus 10, the fluorine gas supply system 18 includes a fluorine gas supply pipe 22 connected to the gas supply pipe 17, a fluorine gas valve 23 disposed in the fluorine gas supply pipe 22, and a fluorine gas supply part 24 connected to the fluorine gas supply pipe 22. The ammonia gas supply system 19 includes an ammonia gas supply pipe 25 connected to the gas supply pipe 17, an ammonia gas valve 26 disposed in the ammonia gas supply pipe 25, and an ammonia gas supply part 27 connected to the ammonia gas supply pipe 25. The argon gas supply system 20 includes an argon gas supply pipe 28 connected to the gas supply pipe 17, an argon gas valve 29 disposed in the argon gas supply pipe 28, and an argon gas supply part 30 connected to the argon gas supply pipe 28. The nitrogen gas supply system 21 includes a nitrogen gas supply pipe 31 connected to the gas supply pipe 17, a nitrogen gas valve 32 disposed in the nitrogen gas supply pipe 31, and a nitrogen gas supply part 33 connected to the nitrogen gas supply pipe 31.

The fluorine gas supply system 18 supplies a fluorine gas to the buffer chamber 15 via the gas supply pipe 17. At this time, the fluorine gas supply system 18 adjusts a supply flow rate of the fluorine gas. The fluorine gas valve 23 is configured to open or close the fluorine gas supply pipe 22. The ammonia gas supply system 19 supplies an ammonia gas to the buffer chamber 15 via the gas supply pipe 17. At this time, the ammonia gas supply system 19 adjusts a supply flow rate of the ammonia gas. The ammonia gas valve 26 is configured to open or close the ammonia gas supply pipe 25. The argon gas supply system 20 supplies an argon gas to the buffer chamber 15 via the gas supply pipe 17. At this time, the argon gas supply system 20 adjusts a supply flow rate of the argon gas. The argon gas valve 29 is configured to open or close the argon gas supply pipe 28. The nitrogen gas supply system 21 supplies a nitrogen gas to the buffer chamber 15 via the gas supply pipe 17. At this time, the nitrogen gas supply system 21 adjusts a supply flow rate of the nitrogen gas. The nitrogen gas valve 32 is configured to open or close the nitrogen gas supply pipe 31. The argon gas supplied from the argon gas supply system 20 or the nitrogen gas supplied from the nitrogen gas supply system 21 is used as a purge gas or a dilution gas.

The shower head 13 supplies the fluorine gas, the ammonia gas, the argon gas, or the nitrogen gas supplied to the buffer chamber 15, into the chamber 11 via each of the gas vent holes 16. The stage 12 is disposed in the bottom portion of the chamber 11. A temperature adjuster 34 for adjusting the temperature of the stage 12 is installed inside the stage 12. The temperature adjuster 34 is composed of, for example, a heater, and heats the wafer W mounted on the stage 12.

In addition, the etching apparatus 10 includes a control unit 35 for controlling each component of the etching apparatus 10. The control unit 35 includes a process controller composed of a microprocessor (computer) and a storage part composed of a memory. The storage part stores a control program for realizing the supply of various gases used for a desired process executed in the etching apparatus 10 and the exhaust of the interior of the chamber 11 under the control of the process controller, a processing recipe as a control program for causing each component of the etching apparatus 10 to execute a respective predetermined process according to a processing condition, various databases, and the like. The control unit 35 calls the processing recipe or the like from the storage part and causes the process controller to execute the called processing recipe, thereby executing a desired process, for example, an SiB removal process to be described later.

Figure 2A:
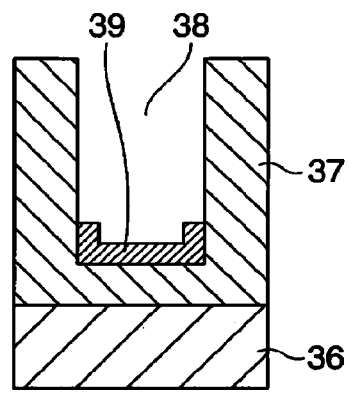
FIGS. 2A to 2C are partially enlarged sectional views showing a wafer which is subjected to a SiB removal process as a boron-doped silicon (SiB) removing method according to an embodiment of the present disclosure.
Figure 2B:
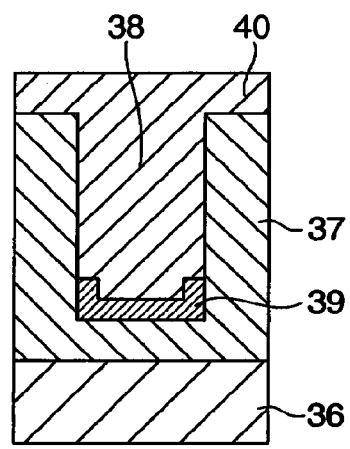
Figure 2C:
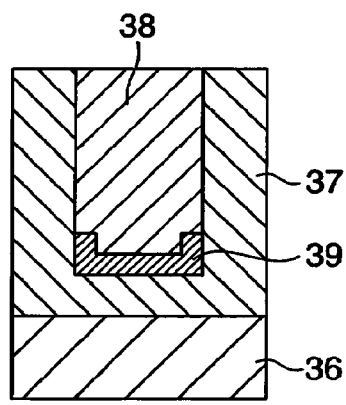

FIGS. 2A to 2C are partially enlarged sectional views showing a wafer which is subjected to an SiB removal process as a boron-doped silicon removing method according to an embodiment of the present disclosure.

The wafer W includes a silicon oxide layer 37 formed on a silicon base 36 by a thermal oxidation process, and an amorphous silicon layer 39 formed at a bottom portion of a trench 38. The trench 38 is formed by performing lithography or the like on the silicon oxide layer 37 (FIG. 2A). In a three-dimensional mounting device manufactured from the wafer W, a film-forming process is performed on the wafer W so that the interior of the trench 38 is filled with SiB. The interior of the trench 38 is fully filled with SiB in the film-forming process. Thus, the SiB seeps out from the trench 38. A surplus SiB forms an SiB layer 40 as a target layer (FIG. 2B). The SiB layer 40 obstructs a lamination process of the three-dimensional mounting device. For this reason, the SiB layer 40 is removed by the SiB removing process to be described later (FIG. 2C).

FIGS. 3A to 3D are process views showing the SiB removal process as the boron-doped silicon removing method according to an embodiment of the present disclosure.

Figure 3A:
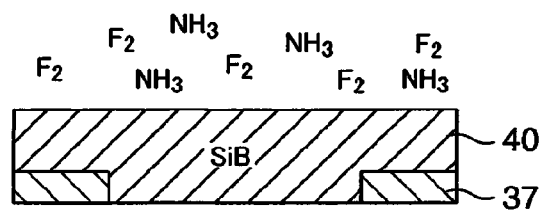
FIGS. 3A to 3D are process views showing the SiB removal process as the boron-doped silicon removing method according to an embodiment of the present disclosure.

First, the wafer W is mounted on the stage 12 inside the chamber 11 of the etching apparatus 10. A fluorine gas as a halogen gas, an ammonia gas, an argon gas, and a nitrogen gas are supplied to the interior of the chamber 11 from the fluorine gas supply system 18, the ammonia gas supply system 19, the argon gas supply system 20, and the nitrogen gas supply system 21 via the shower head 13 (FIG. 3A). At this time, the fluorine gas chemically reacts with SiB of the SiB layer 40 as shown in the following formula (1) to generate silicon tetrafluoride (SiF$_4$) and boron tetrafluoride (BF$_4$). Further, the ammonia gas acts as a catalyst to promote the chemical reaction represented by the following formula (1).

$$\text{SiB} + 4\text{F}_2 + \text{NH}_3 \rightarrow \text{SiF}_4\uparrow + \text{BF}_4\uparrow + \text{NH}_3 \quad (1)$$
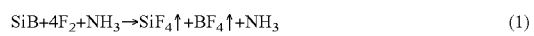

Here, the silicon tetrafluoride and the boron tetrafluoride are also sublimated and are discharged from the interior of the chamber 11 by the exhaust unit 14. As a result, SiB is removed.

Incidentally, a portion of the ammonia gas chemically reacts with the fluorine gas as shown in the following formula (2) to generate a hydrogen fluoride gas. In the following formula (2), "F*" denotes a fluorine radical.

$$7\text{F}_2 + 2\text{NH}_3 \rightarrow 2\text{NF}_3 + 2\text{F}^* + 6\text{HF} \quad (2)$$

The hydrogen fluoride gas generated thus chemically reacts with the sublimated silicon tetrafluoride and the ammonia gas as shown in the following formula (3) to generate an ammonium fluorosilicate (hereinafter, referred to as "AFS"), which is a silicon-containing byproduct.

$$\text{SiF}_4 + 2\text{HF} + 2\text{NH}_3 \rightarrow (\text{NH}_4)_2\text{SiF}_4 \quad (3)$$

Further, the generated hydrogen fluoride gas chemically reacts with the sublimated boron tetrafluoride and the ammonia gas as shown in the following formula (4) to generate an ammonium fluoroborate (hereinafter, referred to as "AFB"), which is a boron-containing byproduct.

$$\text{BF}_4 + 2\text{HF} + 2\text{NH}_3 \rightarrow (\text{NH}_4)_2\text{BF}_4 \quad (4)$$

Figure 3B:
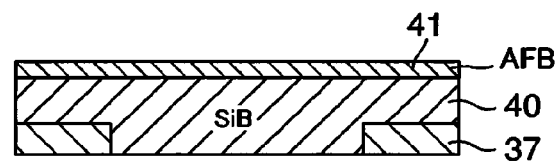
Figure 3C:
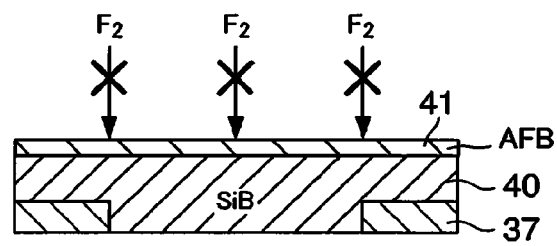

AFS is unlikely to remain because it is relatively easy to be decomposed and sublimated. In the meanwhile, AFB is difficult to be decomposed and sublimated as compared with AFS. Thus, an AFB layer 41 remains so as to cover the SiB layer 40 which remains unetched (FIG. 3B). The AFB layer 41 inhibits the fluorine gas from coming into contact with the SiB layer 40. This inhibits the SiB and the fluorine gas from newly chemically reacting with each other (see the above formula (1)) (FIG. 3C).

Figure 3D:
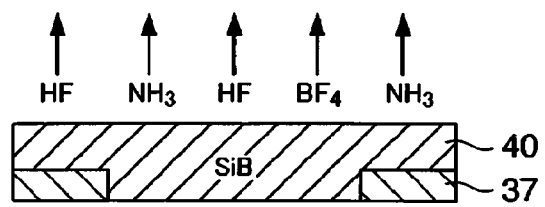

In the present process, the wafer W mounted on the stage 12 is heated by the temperature adjuster 34 of the stage 12. At this time, a chemical reaction represented by the following formula (5) proceeds by thermal energy, so that AFB of the AFB layer 41 is decomposed into a boron tetrafluoride, an ammonia gas, and a hydrogen fluoride gas, and is sublimated (FIG. 3D). As a result, the AFB layer 41 is removed and a new chemical reaction between SiB and the fluorine gas (see the above formula (1)) proceeds.

$$(NH_4)_2BF_4 \rightarrow BF_4 + 2HF + 2NH_3 \quad (5)$$

Thereafter, the present process is terminated.

According to the processes of FIGS. 3A to 3D, the wafer W including the SiB layer 40 made of SiB is exposed to the fluorine gas and the ammonia gas. At this time, SiB and the fluorine gas react with each other to generate the silicon tetrafluoride and the boron tetrafluoride. The silicon tetrafluoride and the boron tetrafluoride are sublimated so that SiB is etched. At the same time, AFB as a byproduct is generated. This AFB inhibits the new chemical reaction between SiB and the fluorine gas. In this regard, in the processes of FIGS. 3A to 3D, since the wafer W is heated by the temperature adjuster 34, the AFB which inhibits the reaction between SiB and the fluorine gas is heated and sublimated. Thus, it is possible to suppress the AFB from inhibiting the new chemical reaction between SiB and the fluorine gas. As a result, the generation and sublimation of the silicon tetrafluoride and the boron tetrafluoride are continuously performed, so that SiB can be suitably etched.

Next, examples of the present disclosure will be described.

First, the present inventors prepared a test piece (hereinafter, referred to as "polysilicon piece") including a polysilicon layer formed on a substrate. The substrate includes a silicon oxide layer formed by a thermal oxidation process. Further, the present inventors prepared a test piece (hereinafter, referred to as "1% SiB piece") including an SiB layer (hereinafter, referred to as "1% SiB layer") doped with an amount of boron of about 1%, which is formed on the substrate, and prepared a test piece (hereinafter, referred to as "5% SiB piece") including an SiB layer (hereinafter, referred to as "5% SiB layer") doped with an amount of boron of about 5%, which is formed on the substrate.

Subsequently, in the etching apparatus 10, the temperature of the stage 12 was adjusted to 80 degrees C. by the temperature adjuster 34. Etching amounts of the polysilicon layer and the SiB layer in the polysilicon piece, the 1% SiB piece, and the 5% SiB piece when the fluorine gas, the ammonia gas, the argon gas, and the nitrogen gas were supplied into the chamber 11 were measured and compared with each other. In addition, at the same time, an etching amount of the silicon oxide layer in each test piece was also measured. At this time, a flow rate of the ammonia gas was set to 15 sccm and 25 sccm. A partial pressure of the ammonia gas was set to two levels of 17.3 mTorr and 28.8 mTorr in terms of partial pressure in consideration of the interior of the chamber 11. In addition, the measurement results of each etching amount are shown in the graph of FIG. 4. In the graph of FIG. 4, the solid line indicates an etching amount of the SiB layer in the 1% SiB piece (hereinafter, referred to as "1% SiB etching amount"). The thick dashed line indicates an etching amount of the SiB layer in the 5 SiB piece (hereinafter, referred to as "5% SiB etching amount"). The thin dashed line indicates an etching amount of the polysilicon layer in the polysilicon piece (hereinafter referred to as "polysilicon etching amount"). The dashed-dotted line indicates an etching amount of the silicon oxide layer (hereinafter referred to as "silicon oxide etching amount").

As can be seen from the graph in FIG. 4, when the partial pressure of the ammonia gas is 17.3 mTorr, the 1 SiB etching amount exceeded the polysilicon etching amount. When the partial pressure of the ammonia gas is 28.8 mTorr, in the graph of FIG. 4, the polysilicon etching amount exceeded the 1 SiB etching amount. However, the 1 SiB piece undergone over-etching in an actual case. Thus, even in this case, it was estimated that the 1% SiB etching amount exceeded the polysilicon etching amount. An amount of generation of the AFB was reduced along with a reduction in the amount of boron doped to the SiB layer. The removal of the AFB by the sublimation was reliably performed. Thus, the etching of SiB was accelerated. In addition, the sublimation of the AFB was more accelerated along with an increase in the temperature of the stage 12 so that etching of SiB was accelerated. Therefore, it was found that the temperature of the stage 12 was set to at least 80 degrees C. while exposing the SiB layer to the fluorine gas or the ammonia gas, in order to suitably etch the SiB layer doped with an amount of boron of 1% or less. In addition, it was confirmed that the silicon oxide etching amount was very small at any level of the partial pressure of the ammonia gas so that a selectivity of the 1% SiB layer to the silicon oxide layer was 100 or more.

Meanwhile, at any level of the partial pressure of the ammonia gas, the 5% SiB etching amount was lower than the polysilicon etching amount. This is presumably because the amount of boron doped to the SiB layer was increased and the generated AFB was increased, which makes it impossible to sublimate all the AFB even if the temperature of the stage 12 was set at 80 degrees C. Thus, the AFB layer remained and inhibited the new chemical reaction between SiB and the fluorine gas. Therefore, it was found that it is difficult to suitably etch the 5% SiB layer even if the temperature of the stage 12 is set at 80 degrees C.

Subsequently, in the etching apparatus 10, the temperature of the stage 12 was adjusted to 90 degrees C. by the temperature adjuster 34. Etching amounts of the polysilicon layer and the SiB layer in the polysilicon piece, the 1% SiB piece, and the 5% SiB piece when the fluorine gas, the ammonia gas, the argon gas, and the nitrogen gas were supplied into the chamber 11 were measured and compared with each other. At this time, the flow rate of the ammonia gas was set to five levels of 1 sccm, 10 sccm, 15 sccm, 25 sccm, and 35 sccm (the partial pressure of the ammonia gas was 1.2 mTorr, 11.6 mTorr, 17.3 mTorr, 28.8 mTorr, and 40.6 mTorr). In addition, the measurement results of each etching amount are shown in the graph of FIG. 5. In the graph of FIG. 5, the solid line and "●" indicate the 1% SiB etching amount, the thick broken line and "▲" indicate the 5% SiB etching amount, the thin broken line and "■" indicate the polysilicon etching amount, and the dashed-dotted line and "x" indicate the silicon oxide etching amount.

As can be seen from the graph in FIG. 5, the 1% SiB etching amount exceeded the polysilicon etching amount at any level of the partial pressure of the ammonia gas.

Therefore, when the temperature of the stage 12 is at least 90 degrees C., it was found that it is necessary to set the partial pressure of the ammonia gas to at least 1.2 mTorr in order to suitably etch the SiB layer doped with an amount of boron of 1% or less.

In addition, the 5% SiB etching amount exceeded the polysilicon etching amount when the flow rate of the ammonia gas falls within a range of 1 sccm to 12 sccm, namely when the partial pressure of the ammonia gas falls within a range of 1.2 mTorr to 13.9 mTorr. Therefore, when the temperature of the stage 12 is 90 degrees C. or higher, it was found that it is necessary to set the partial pressure of the ammonia gas to fall within a range of 1.2 mTorr to 13.9 mTorr in order to suitably etch the SiB layer doped with an amount of boron of 5% or less. Here, it was presumed that the reason why the SiB layer doped with an amount of boron of 5% or less can be suitably etched when the temperature of the stage 12 was changed from 80 degrees C. to 90 degrees C. is because the sublimation of the AFB was accelerated due to the increase in the temperature of the stage 12 so that the AFB layer did not remain to prevent the inhibition of the new chemical reaction between SiB and the fluorine gas.

In addition, it was confirmed that the silicon oxide etching amount was very small at any level of the partial pressure of the ammonia gas so that the selectivity of the 1 SiB layer or the SiB layer to the silicon oxide layer was 100 or more.

Figure 6:
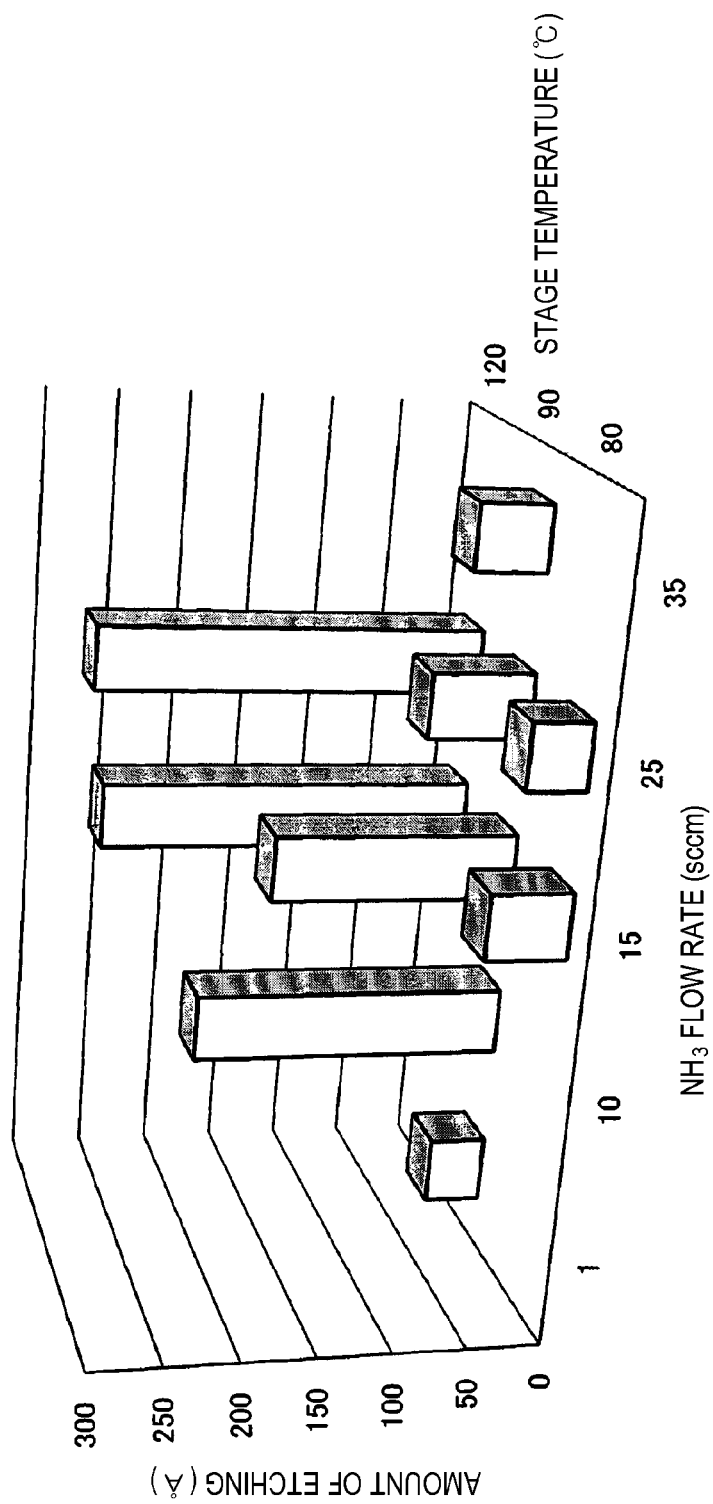
FIG. 6 is a graph showing an etching amount of an SiB layer doped with an amount of boron of about 5% when the stage temperature and a partial pressure of an ammonia gas are changed.

Subsequently, in the etching apparatus 10, the temperature of the stage 12 was adjusted to three levels of 80 degrees C., 90 degrees C., and 120 degrees C. by the temperature adjuster 34. The 5% SiB etching amount in the 5% SiB piece when the fluorine gas, the ammonia gas, the argon gas, and the nitrogen gas were supplied into the chamber 11 were measured. The measurement results of each etching amount are shown in the graph of FIG. 6. At this time, the flow rate of the ammonia gas was set to five levels of 1 sccm, 10 sccm, 15 sccm, 25 sccm, and 35 sccm (the partial pressure of the ammonia gas was 1.2 mTorr, 11.6 mTorr, 17.3 mTorr, 28.8 mTorr, and 40.6 mTorr).

As can be seen from the graph of FIG. 6, it was confirmed that, for example, in a case in which the partial pressure of the ammonia gas is 17.3 mTorr, the 5% SiB etching amount abruptly increases when the temperature of the stage 12 exceeds 90 degrees C. Also, it was confirmed that, in a case in which the partial pressure of the ammonia gas is 28.8 mTorr, the 5% SiB etching amount abruptly increases when the temperature of the stage 12 exceeds 120 degrees C. That is to say, it was confirmed that the sublimation of the AFB was accelerated along with the increase in the temperature of the stage 12, thus accelerating the etching of SiB.

Meanwhile, it was confirmed that the 5% SiB etching amount was reduced along with an increase in the partial pressure of the ammonia gas, regardless of whether the temperature of the stage 12 was 80 degrees C. or 90 degrees C. It was presumed that this is because the generation amount of the AFB was increased along with the increase in the partial pressure of the ammonia gas and an amount of remaining AFB layer was increased to further inhibit the new chemical reaction between SiB and the fluorine gas. In addition, when the temperature of the stage 12 was 120 degrees C., it was not confirmed that the 5% SiB etching amount was reduced because over-etching occurred even at any level of the partial pressure of the ammonia gas. However, it was presumed that the 5% SiB etching amount was reduced along with the increase in the partial pressure of the ammonia gas as in the case in which the temperature of the stage 12 was 80 degrees C. or 90 degrees C.

Finally, in the etching apparatus 10, the temperature of the stage 12 was adjusted to 120 degrees C. by the temperature adjuster 34. A time-dependent change in etching amounts of the polysilicon layer and the SiB layer in the polysilicon piece, the 1% SiB piece, and the 5% SiB piece when the fluorine gas, the ammonia gas, the argon gas, and the nitrogen gas were supplied into the chamber 11 was measured. At this time, the flow rate of the ammonia gas was set to 25 sccm (the partial pressure of the ammonia gas was 28.8 mTorr). In addition, the measurement results of the time-dependent change in each etching amount are shown in the graph of FIG. 7. In the graph of FIG. 7, the solid line and "●" indicate the 1% SiB etching amount, the thick broken line and "▲" indicate the 5% SiB etching amount, the thin broken line and "■" indicate the polysilicon etching amount, and the dashed-dotted line and "x" indicate the silicon oxide etching amount.

As can be seen from the graph in FIG. 7, both the 1% SiB etching amount and the 5% SiB etching amount exceeded the polysilicon etching amount while the etching was continued. In particular, when the etching time exceeded 60 seconds, over-etching of the SiB layer occurred not only on the 1% SiB piece but also on the 5% SiB piece. Therefore, it was found that it is necessary to set the temperature of the stage 12 to at least 120 degrees C. while exposing the SiB layer to the fluorine gas or the ammonia gas, in order to suitably etch the SiB layer doped with an amount of boron of 5% or less. It was presumed that the reason why the SiB layer doped with an amount of boron of 5% or less can be suitably etched when the temperature of the stage 12 was set to at least 120 degrees C. is because the sublimation of the AFB was accelerated due to the increase in the temperature of the stage 12 so that the AFB layer did not remain completely to completely prevent the inhibition of the new chemical reaction between SiB and the fluorine gas. In addition, it was confirmed that the silicon oxide etching amount was very small while etching was continued so that the selectivity of the 1 SiB layer or the 5 SiB layer to the silicon oxide layer was 100 or more.

Although the embodiments of the present disclosure have been described above, the present disclosure is not limited to the embodiments described above.

For example, in the above-described SiB removal process, the fluorine gas is used as a halogen gas. However, any halogen gas may be used as long as it chemically reacts with SiB to generate halogenated silicon or halogenated boron. As an example, a chlorine ($Cl_2$) gas and a bromine ($Br_2$) gas can be used as the halogen gas.

Moreover, the present disclosure may be achieved by providing a memory part that stores a program code of a software for implementing respective functions of the above embodiments to a process controller including the control unit 35, and by allowing a central processing unit of the process controller to read and execute the program code stored in the memory part.

In such a case, the program code itself which read from the memory part implements the respective functions of the above embodiments, and the program code and the memory part that stores the program code constitute the present disclosure.

In addition, examples of the memory part may include RAM, NV-RAM, a floppy (registered mark) disk, a hard disk, an optomagnetic disk, an optical disk such as CD-ROM, CD-R, CD-RW and DVD (DVD-ROM, DVD-RAM, DVD-RW, DVD+RW), a magnetic tape, a nonvolatile memory card, and other ROMs, which are capable of storing the program code. Alternatively, the program code may be provided to the process controller by downloading from another computer and data base (both not shown) which are connected to an internet, a commercial network, a local area network or the like.

Further, the respective functions of the above embodiments may be implemented by executing the program code which is read by the process controller, and by allowing an OS (operating system) running on the CPU to execute some or all of the actual processes based on an instruction of the program code.

Further, the respective functions of the above embodiments may be implemented by writing the program code read from the memory part into a memory provided in a function expansion board inserted into the process controller or a function expansion unit connected to the process controller, and by allowing a CPU or the like provided in the function expansion board or the function expansion unit to execute some or all of the actual processes based on an instruction of the program code.

The program code may be configured in a form such as an object code, a program code executed by an interpreter, a script data provided to the OS, or the like.

This application claims priority based on Japanese Patent Application No. 2016-117950 filed on Jun. 14, 2016, the entire contents of which are incorporated herein by reference.

EXPLANATION OF REFERENCE NUMERALS

W: wafer, 10: etching apparatus, 12: stage, 34: temperature adjuster, 40: SiB layer, 41: AFB layer

What is claimed is:

1. A substrate processing method comprising:
   mounting a substrate including a target layer made of a boron-doped silicon on a mounting table;
   forming a reaction product on the target layer of the substrate by exposing the target layer to a mixture of an ammonia gas ($NH_3$) and a halogen gas selected from a group consisting of a fluorine ($F_2$) gas, a chlorine ($Cl_2$) gas, and a bromine ($Br_2$) gas, without using plasma; and
   sublimating the reaction product by heating the substrate mounted on the mounting table while adjusting a temperature of the mounting table to a predetermined temperature based on an amount of boron contained in the boron-doped silicon.

2. The substrate processing method of claim 1, wherein when the boron-doped silicon which constitutes the target layer has the amount of boron of 1% or less, the predetermined temperature is adjusted to 80 degrees C. or higher.

3. The substrate processing method of claim 1, wherein the selected halogen gas is the fluorine ($F_2$) gas.

4. The substrate processing method of claim 1, wherein when the boron-doped silicon which constitutes the target layer has the amount of boron of 5% or less, the predetermined temperature is adjusted to 90 degrees C. or higher.

5. The substrate processing method of claim 4, wherein when the boron-doped silicon which constitutes the target layer has the amount of boron of 5% or less, the predetermined temperature is adjusted to 120 degrees C. or higher.

6. A method of removing a boron-doped silicon, comprising:
   forming a reaction product on a target layer, which is made of the boron-doped silicon, of a substrate mounted on a mounting table by exposing the target layer to a mixture of an ammonia gas ($NH_3$) and a halogen gas selected from a group consisting of a fluorine ($F_2$) gas, a chlorine ($Cl_2$) gas, and a bromine ($Br_2$) gas, without using plasma; and
   sublimating the reaction product by heating the substrate mounted on the mounting table while adjusting a temperature of the mounting table to a predetermined temperature based on an amount of boron contained in the boron-doped silicon.

7. The method of claim 6, wherein when the boron-doped silicon which constitutes the target layer has the amount of boron of 1% or less, the predetermined temperature is adjusted to 80 degrees C. or higher.

8. The method of claim 6, wherein the selected halogen gas is the fluorine ($F_2$) gas.

9. The method of claim 6, wherein when the boron-doped silicon which constitutes the target layer has the amount of boron of 5% or less, the predetermined temperature is adjusted to 90 degrees C. or higher.

10. The method of claim 9, wherein when the boron-doped silicon which constitutes the target layer has the amount of boron of 5% or less, the predetermined temperature is adjusted to 120 degrees C. or higher.

* * * * *